United States Patent [19]
Herdt et al.

[11] Patent Number: 4,980,861
[45] Date of Patent: Dec. 25, 1990

[54] NAND STACK ROM

[75] Inventors: Christian E. Herdt, Colorado Springs, Colo.; Steven H. Cliadakis, Mesa, Ariz.

[73] Assignee: Microchip Technology Incorporated, Chandler, Ariz.

[21] Appl. No.: 287,570

[22] Filed: Dec. 16, 1988

Related U.S. Application Data

[63] Continuation of Ser. No. 3,837, Jan. 16, 1987, abandoned.

[51] Int. Cl.[5] .......................... G11C 7/00; G11C 17/00
[52] U.S. Cl. .................................... 365/203; 365/104
[58] Field of Search ............... 365/103, 104, 203, 189; 307/530

[56] References Cited

U.S. PATENT DOCUMENTS 4,636,664 1/1987 Craycraft et al. .................. 365/104

Primary Examiner—Terrell W. Fears
Assistant Examiner—Melissa J. Koval
Attorney, Agent, or Firm—James & Franklin

[57] ABSTRACT

Faster access time is achieved in a NAND stack ROM by eliminating depletion mode decode transistors, thus reducing column capacitance. Horizontal ground straps of diffusion are eliminated to reduce chip area by running virtual ground lines vertically through the array. Adjacent columns are tied to alternating sense amplifiers utilizing a simple multiplexer connected to the virtual ground lines.

4 Claims, 4 Drawing Sheets

NAND STACK ROM

This is a continuation of co-pending application Ser. No. 003,837 filed on Jan. 16, 1987 now abandoned.

The present invention relates to electronic memories and, more particularly, to a NAND stack Read Only Memory (ROM) design which substantially reduces array size and column capacitance, hence decreasing total chip area and column charge-up time.

The present invention is a memory design which utilizes a dense array packing technique and leads itself to easy decoding. The design takes advantage of the increased packing density of the conventional NAND ROM configuration (over the more traditional NOR ROM configuration) and, at the same time, eliminates most of multiplexing present in the conventional NAND ROM design. Accordingly, array size and capacitance are significantly reduced, leading to smaller chip dimensions and faster access times.

NAND stack ROM arrays consist of columns of series connected semiconductor switching devices. The devices are fabricated as either enhancement mode or depletion mode devices to reflect programmed data. In the conventional NAND stack ROM configuration, the stacks are configured in pairs, called "pages." Each page consists of two spaced parallel stacks of series connected bit transistors. Each page has a "one of two" multiplexer formed from four page decode transistors. Two page decode transistors are located at the end of each stack, a depletion mode transistor, and an enhancement mode transistor. To read data, the proper page decode line is brought high, accessing a particular page. Simultaneously, one of the bit decode lines is brought low and the input to the sense amplifier, which is selected by a multiplexer at the top of the array, either rises or falls.

Each stack in the ROM of the present invention has one less decode transistor in it than the stack of a conventional NAND stack ROM with the same number of bits. Hence, a 256k array with 8-bit high stacks in the configuration of the present invention has over 32,000 fewer transistors than a comparable array in the conventional arrangement. Furthermore, in the present invention, there is no need for horizontal ground straps of diffusion, required in the conventional layout. Column selection is achieved utilizing "virtual grounds" lines running vertically in the array. These two difference make the array of the present invention about 10% shorter than the comparable conventional array, when drawn with the same set of design rules.

The depletion page decode transistors in the conventional array and its larger array length add to the column capacitance. ROMs designed in accordance with the present invention have columns which are 40% less capacitive as calculated using the same design rules and process parameters. This translates into a 12%-20% decrease in column charge-up time, depending upon the operating voltage of the ROM column.

Adjacent columns in the ROM array of the present invention are tied to alternating sense amplifiers in the same way as X-matrix ROM columns are organized. Interference between a column being selected and adjacent columns, as well as sneak paths, which are current problems in X-martrix NOR ROM designs, are significantly reduced.

The multiplexer interposed between the stacks and the sense amplifier are actuated by the same virtual ground lines, which run vertically in the array. These lines do not increase the array's width since the lines' horizontal axis is diffusion limited in the process technology used to develop the invention. In the conventional array, by contrast, the multiplexer is gated by lines running horizontally along the top of the array using extra chip area. Because of these dual purpose virtual ground lines in the present invention, a column may have only one multiplexer transistor to pass before the input of its sense amplifier, yet a 256K chip may have as few as one sense amplifier per output, without increasing chip length. Moreover, the present design is technology independent. While the preferred embodiment of the present invention is illustrated in a CMOS implementation, it should be appreciated that an NMOS implementation can also be provided with modifications well within the scope of the art. This new design will reduce power consumption in those NMOS ROMs which limit multiplexing at the top of the array by using more than one sense amplifier per output.

The virtual ground NAND stack ROM design substantially reduces array size and column capacitance, hence, decreasing total chip area and column charge-up time. It also combines the advantages of single transistor multiplexing at the top of the array with the low power consumption associated with limiting the number of sense amplifiers, without increasing the area of the circuitry peripheral to the array. The implementation of the present invention is also expected to significantly improve wafer yields.

It is, therefore, a prime object of the present invention to provide a NAND stack ROM which utilizes a dense array packing technique.

It is another object of the present invention to provide a NAND stack ROM which lends itself to easy decoding.

It is another object of the present invention to provide a NAND stack ROM with faster access times.

It is another object of the present invention to provide a NAND stack ROM wherein column selection is accomplished utilizing virtual ground lines running vertically through the array, thereby eliminating the necessity for horizontal ground straps of diffusion.

It is another object of the present invention to provide a NAND stack ROM with significantly reduced column capacitance.

It is another object of the present invention to provide a NAND stack ROM with a simplified multiplexer.

It is another object of the present invention to provide a NAND stack ROM which reduces the number of sense amplifiers required.

It is another object of the present invention to provide a design technique for fabricating a NAND stack ROM which can be implemented in CMOS or NMOS.

It is another object of the present invention to provide a NAND stack ROM with significantly improved wafer yields.

In accordance with one aspect of the present invention, a NAND stack ROM array is formed in a semiconductor substrate. For the purposes of this disclosure, it is understood that the term "substrate" includes a well or other suitable structure. The array comprises bit select means and a plurality of bit switching means, each having input means and an output circuit. Each of the input means is operably connected to the bit select means. The output circuits are operably connected in series between first and second nodes to form a stack. Substantially colinearly aligned stacks form a column.

Means are provided for applying a virtual ground signal to the first node. The signal applying means comprises a conductive region extending through the substrate in the direction of the column. Means are provided for sensing the state of the second node. Preferably, means are provided for precharging the second node. The precharging means make it possible to optimize the speed of the array.

A single stack select switching means is associated with each stack. It has an output circuit operably interposed between the series connected output circuits of the bit switching means and the second node. The stack select switching means preferably comprises an enhancement mode transistor only.

Multiplex means are operably interposed between the sensing means and the second node. The multiplex means is operably connected to the conductive region.

The second node comprises first and second electrically connected sections located at either end of the column. The first node is located between the stacks.

In accordance with another aspect of the present invention, a NAND stack ROM array formed on a semiconductor substrate is provided including bit select means and bit switching means. Each of the bit switching means has an input means and an output circuit. Rows of input means are operably connected to the bit select means. The output circuits are operably connected in series between first and second nodes to form stacks. Substantially colinearly aligned stacks form columns. Column select menas are provided. The column select means includes a plurality of outputs and means for applying a virtual ground signal to a selected one of the outputs. Conductive regions operably connect each of the outputs to the first node in a different one of the columns. The conductive regions extend through the substrate generally in the direction of the columns. Means are provided for sensing the state of the second node of the column whose first node is connected to the selected output.

Preferably, means are provided for precharging the second node of each of the columns. This permits the speed of the array to be optimized.

The array further comprises stack select means. The stack select means include a single switching means associated with each of the stacks and having an output circuit operably interposed between the bit switching means and the second node. The single switching means preferably comprises an enhancement node transistor only.

Multiplex means are operably interposed between the sensing means and the second node of each of the stacks. The multiplex means are operably connected to the conductive regions.

The sensing means comprises a pair of sense amplifiers. The multiplex means operably connects adjacent stacks to different sense amplifiers in the pair.

In accordance with another aspect of the present invention, a NAND stack ROM array formed on a semiconductor substrate is provided. The array includes bit select means and sets of first and second substantially colinearly aligned stacks of bit switching means. Each bit switching means has an input means and an output circuit. The input means of the stacks in each set are operably connected in rows to the bit select means. The output circuits of the bit switching means of the stacks in each set are operably connected in series. The stacks in each of the sets extend between an intermediate node and first and second ends nodes, respectively. The sets form substantially parallel columns. Column select means are provided. The column select means include a plurarlity of outputs and means for applying a virtual ground signal to a selected one of the outputs. Conductive regions operably connect each of the outputs with a different one of the intermediate nodes and extend through the substrate substantially in a direction of the columns. Means are provided for sensing the state of the end node of the column connected to the selected one of the outputs.

Preferably, means are provided for pre-charging the end nodes of each of the columns. This permits the speed of the array to be optimized. To these and to such other objects which may hereinafter appear, the present invention relates to a NAND stack ROM as set forth in the following specification and recited in the annexed claims, taken together with the accompanying drawings, wherein like numerals refer to like parts, and in which:

Figure 1:
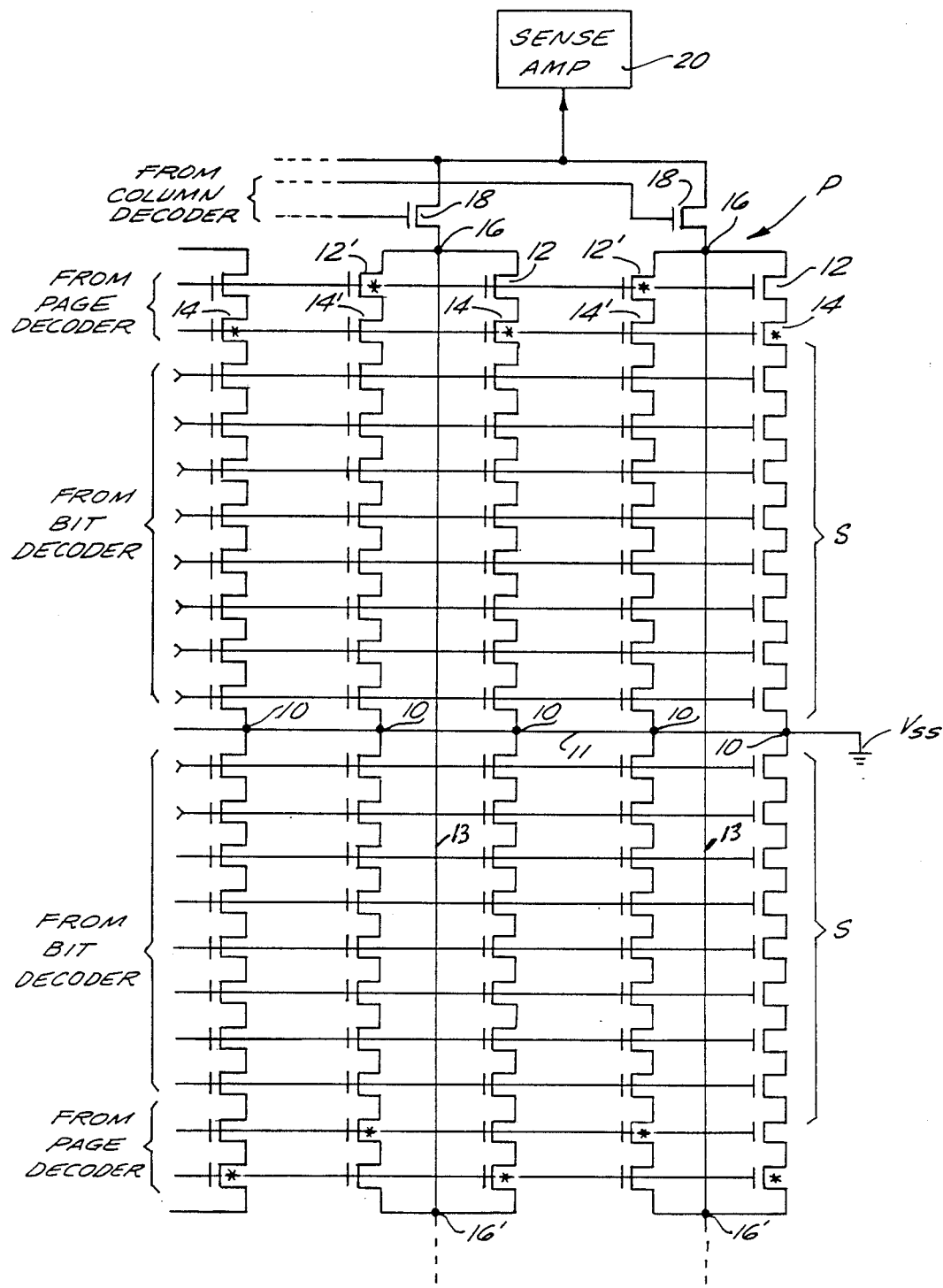
FIG. 1 is a schematic diagram of a conventional NAND stack ROM.
Figure 2:
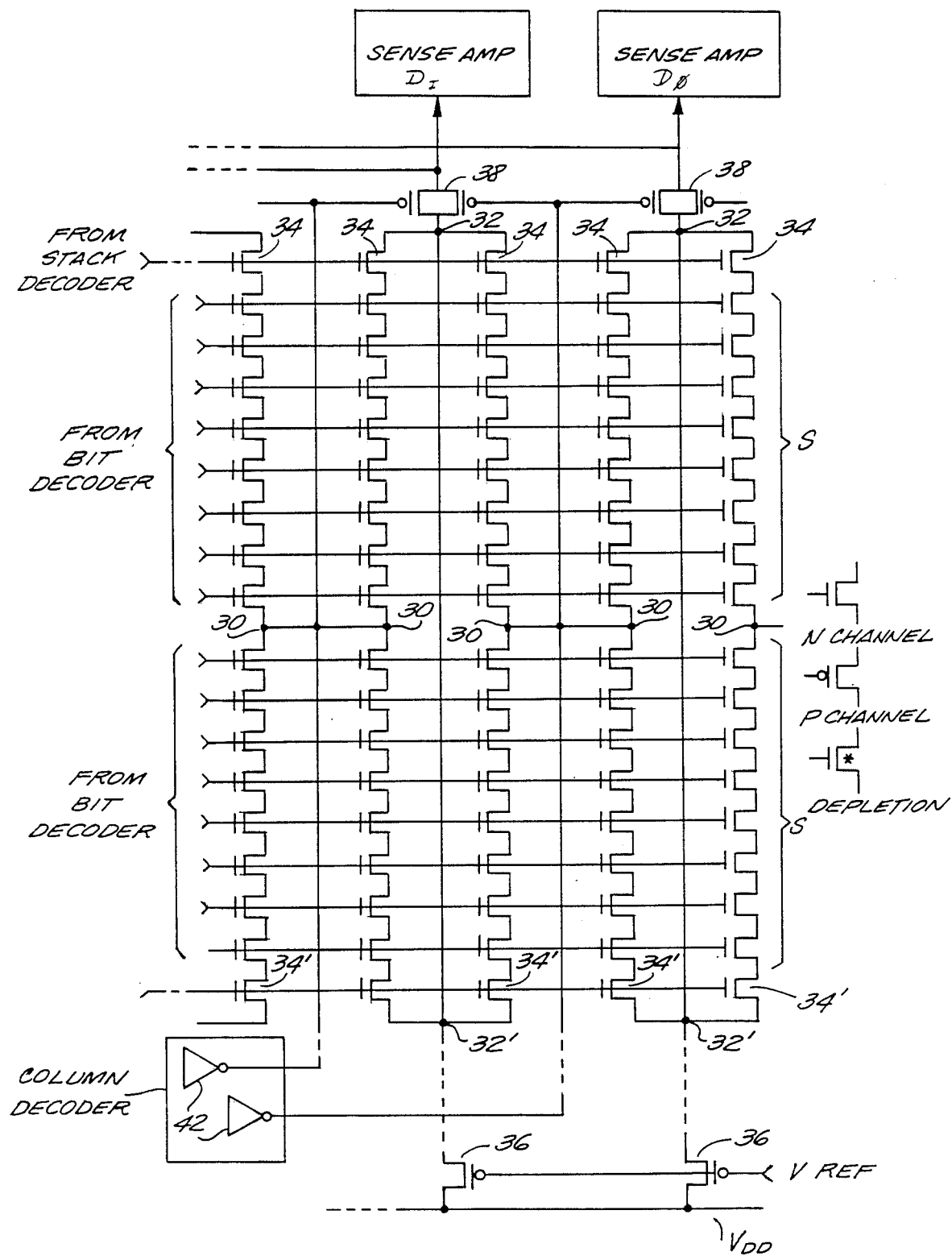
FIG. 2 is a schematic diagram for the NAND stack ROM of the present invention.
Figure 3:
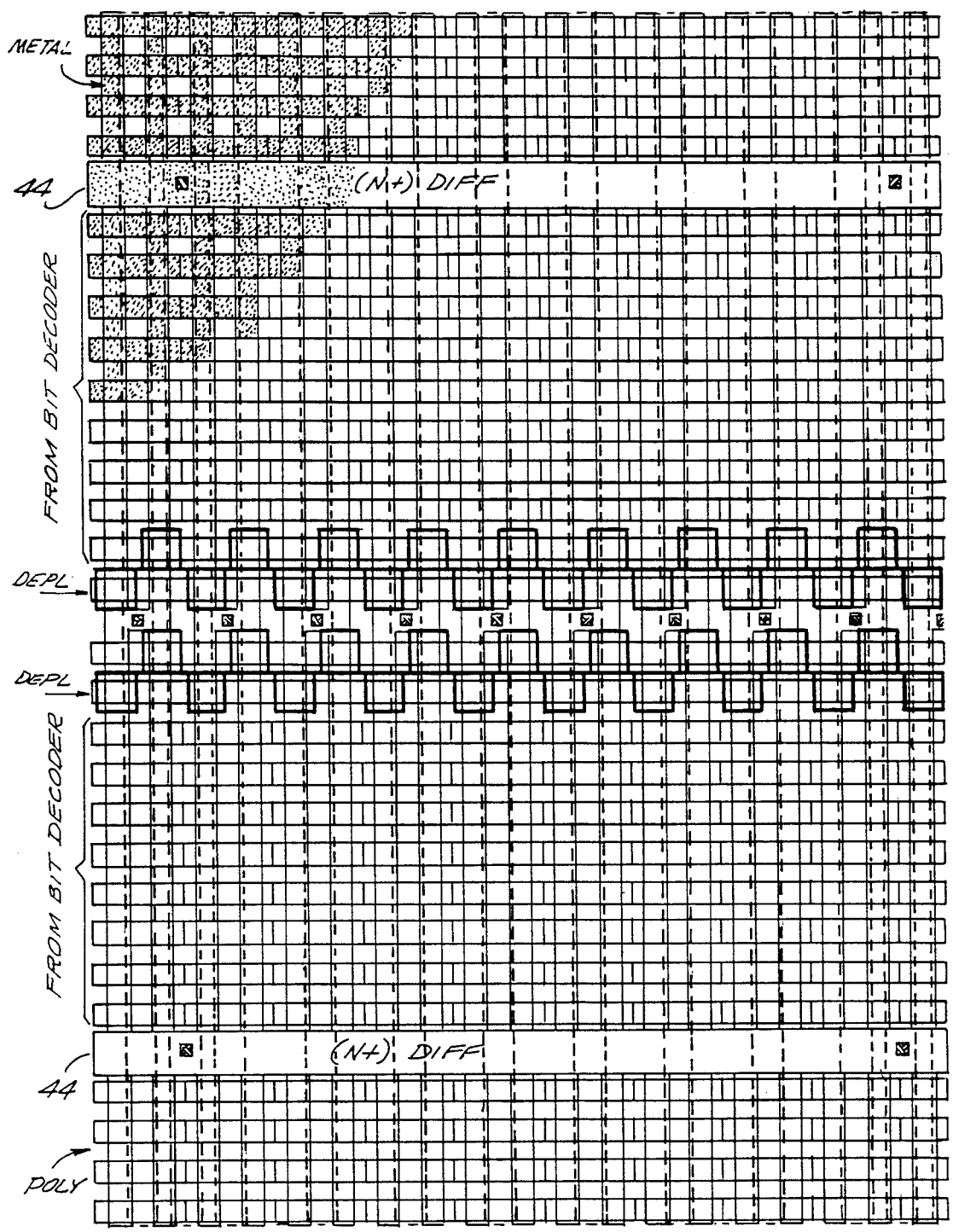
Figure 4:
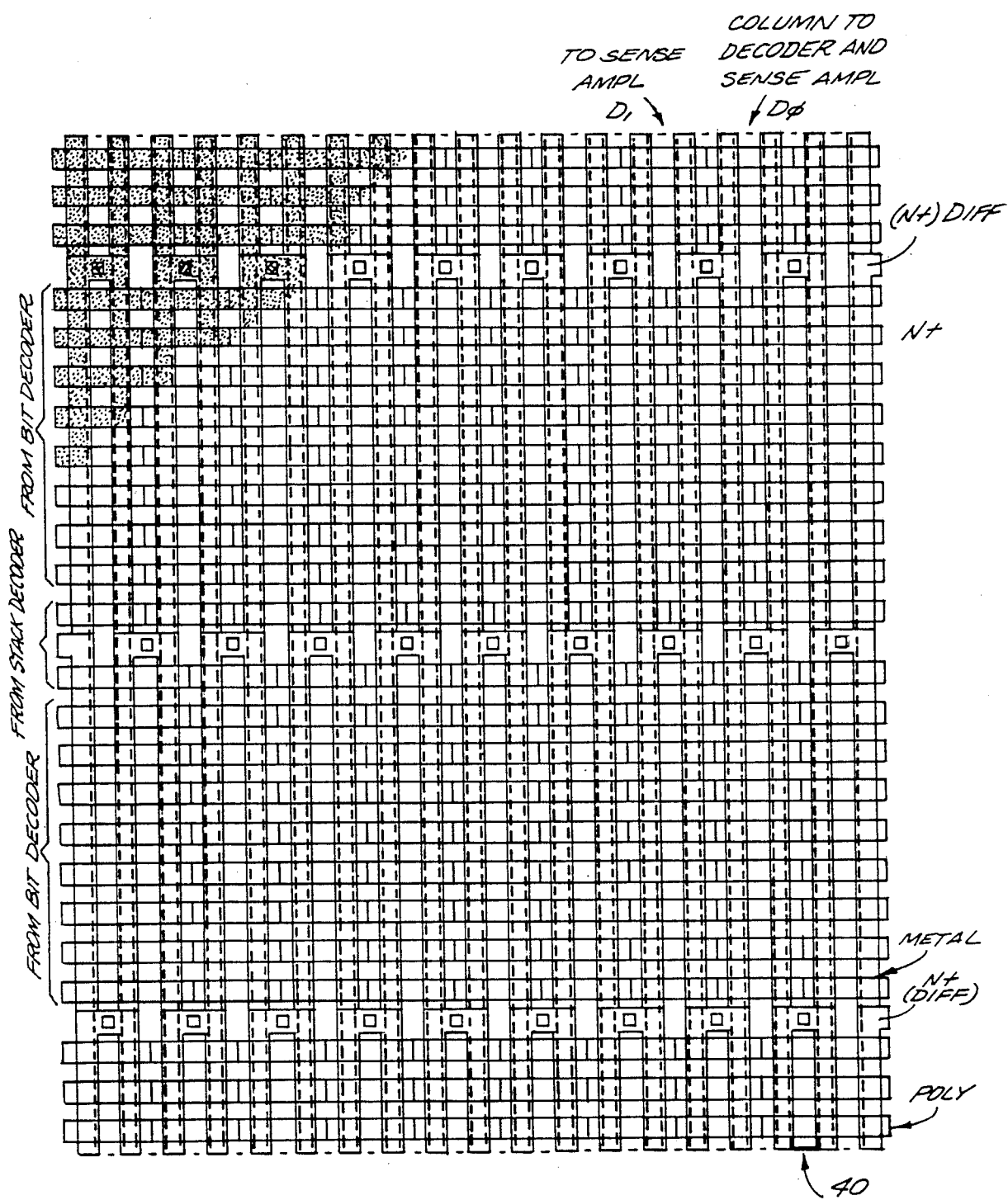

FIG. 3 is an idealized chip layout design for the NAND stack ROM illustrated in FIG. 1; and FIG. 4 is an idealized chip layout for the NAND stack ROM illustrated in FIG. 2. As seen in FIG. 1, a conventional NAND stack ROM includes a substrate or well in which the array is formed. The array includes a plurality of pages, generally designated P, consisting of adjacent stacks S. Each stack S consists of, for example, eight N-channel bit transistors. Colinear stacks S form columns. Each stack S is operably connected between an intermediate node 10 connected to ground by a horizontal diffusion strip 11 and a pair of page decode transistors 12, 14 and 12′, 14′, respectively, one of which is an enhancement mode transistor, and the other of which is a depletion mode transistor. Each pair of page decode transistors 12, 14 and 12′, 14′ are interposed between the stack and an end node 16, 16′. End nodes 16 and 16′ are electrically interconnected by vertical metal lines 13. Node 16 is connected through an N-channel decorder transistor 18 to a sense amplifier 20. node 16′ is connected to the output of a column select circuit. The column select circuit preferably serves to precharge the nodes 16, 16′ of a selected column. This optimizes the speed of the ROM.

Thus, each page includes two stacks consisting of, for example, 8 bit transistors each and a "one of two" multiplexer comprised of the four page decode transistors 12, 14 and 12′, 14′. To read data from the memory, the column select circuit precharges a selected column by applying a voltage to the node 16, 16′ associated therewith. The selected page decode line is then brought high, accessing either the right or left stack of a particular page. Simultaneously, one of the bit decode lines is brought low and the input to the sense amplifier 20, which is selected by the multiplexer 18 at the top of the array, either rises or falls, depending upon whether the selected stack has become conductive, thereby connecting node 16 or 16′ with grounded node 10. If the stack has been conductive, then the charge on the node 16, 16′ will dissipate to ground. Otherwise, node 16, 16′ will charge. This sensed by sense amplifier 20 through transistor 18.

As best seen in FIG. 2, in the ROM of the present invention, the stacks are not configured in pairs. This eliminates the need for the page decode deplection transistors 14, 12'. Each column includes colinear stacks S of (for example) eight N-channel bit transistors with an intermediate node 30 and end nodes 32, 32'. A single enhancement mode stack decode transistor 34, 34' is interposed between the stack and node 32, 32'. Preferably, nodes 32' are connected to a voltage source $V_{DD}$ through a P-channel transistor 36, the input terminal of which is conditionally connected to a voltage reference source $V_{REF}$. This permits the ROM to operate a maximum speed. Node 32 of each column is connected through a pair of parllel P-channel transistors 38 to a sense amplifier.

Nodes 30 are connected to conductive metal lines 40 which run vertically through the substrate. Preferably, lines 40 are parallel to, but spaced from, the columns. Each of the lines 40 extends from the output of a column decoder 42 which applies a "virtual ground" signal of approximately 0 volts to the line when it is selected (otherwise, applies a "high"). Line 40 is connected to nodes 30 of adjacent columns and also to the inputs of P-channel decoder transistors 38.

A particular row of stacks is accessed by bringing the stack decode line high such that the stacks decode transistor 34, 34' of the selected stack S is turned on. A column is selected by bringing a virtual ground line 40 associated therewith to a low state. To read the data, one of the bit lines is brought low at the same time as the stack is accessed and the column is selected. The input of the sense amplifier, connected through multiplex transistors 38 at the top of the column, either rises or falls.

It can now be appreciated that the ROM of the present invention has one less (depletion mode page decode) transistor in it than the conventional NAND stack ROM configuration with the same number of bits. Hence, a 256K array with 8 bit high stacks in the configuration of the present invention has over 32,000 fewer transistors of a comparable conventional array.

FIGS. 3 and 4 show chip layouts for the conventional NAND stack ROM and the ROM of the present invention, respectively. A comparison of FIGS. 3 and 4 indicates that since the virtual ground lines 40 run vertically through the array of the present invention, as illustrated in FIG. 4, there is no need for the horizontal ground straps on N+ diffusion 44, shown in FIG. 3. In addition, the depletion mode transistors 14, 12' are also eliminated. These two difference make the array of the present invention about 10% shorter than a comparable conventional array when drawn with the same set of design rules.

In addition, the depletion page decode transistor 14, 12' in the conventional array mnd its longer array size add to column capacitance. In the present invention, the columns are 40% less capacitive as calculated using the same design rules and process parameters. This translates into a 12%-20% decrease in column charge-up time, depending upon the column operating voltage.

As seen in FIG. 2, adjacent columns in the array of the present invention are tied to alternating sense amplifiers, $D_I$ and $D_O$ in the same way as X matrix ROM columns are organized. Interference between a column being selected and adjacent columns as well as sneak paths, which are common problems in X matrix ROM design, are significantly reduced.

The multiplex transistors 38 are actuated by the same virtual ground lines 40 running vertically up the array. These metal virtual ground lines 40 do not increase the array's width since the array's horizontal axis is diffusion limited in the process technology used to develop the invention. In the conventional array, by contrast, the multiplexer is gated by lines running horizontally along the top of the array, using extra chip area. Because of the dual purpose virtual ground lines 40, a column in the array of the present invention may have only one multiplexing transistor 38, to pass before the input of its sense amplifier, yet a 256K chip may have a few as one sense amplifier per output without increasing chip size.

In addition, it should be appreciated that the array design of the present invention is technology independent. While the circuit disclosed herein is a CMOS implementation of the array of the present invention, it should be appreciated that the same concepts can be used in conjunction with an NMOS implementation. The design of the present invention will reduce power consumption in NMOS ROMs which limit multiplexing at the top of the array by using more than one sense amplifier per output.

It can now be appreciated that the virtual ground NAND stack ROM design of the present invention substantially reduces array size and column capacitance, hence decreasing total chip area and column charge-up time. It also combines the advantages of single transistor multiplexing at the top of the array with the lower power consumption of few sense amplifiers, without increasing the area of the circuitry peripheral to the array. The implementation of the design of the present invention is expected to significantly improve wafer yields.

While only a single preferred embodiment of the present invention has been disclosed herein for purposes of illustration, it is obvious that many variations and modifications could be made thereto. It is intended to cover all of these variations and modifications which fall within the scope of the present invention, as recited in the following claims:

We claim:

1. A NAND Stack ROM array formed in a substrate comprising first and second substantially parallel, spaced columns of series connected bit switching means formed in said substrate, each of said columns comprising a stack of said bit switching means, a first node at one end of said stack, a second node at the other end of said stack and stack decode means wherein said stack decode means comprises a single enhancement mode transistor interposed between said stack and said first node, means for precharging said first node, first and second sense amplifiers, means, effective when actuated, for operably connecting said first node of a selected column with one of said first and second sense amplifiers and means for generating and applying a virtual ground signal to said connecting means associated with said selected column to actuate same and to said second node of said selected column, said signal applying means comprising a conductive region in said substrate extending between and in the same general direction in said substrate as said columns.

2. The ROM of claim 1 wherein each of said columns comprises colinearly aligned stacks.

3. The ROM of claim 2 wherein said second node is interposed between said stacks.

4. The ROM of claim 2 wherein said first node comprises end nodes at each end of said column.

* * * * *